United States Patent
Lai et al.

(10) Patent No.: US 8,086,981 B2
(45) Date of Patent: Dec. 27, 2011

(54) METHOD AND SYSTEM FOR DESIGN RULE CHECKING ENHANCED WITH PATTERN MATCHING

(75) Inventors: Ya-Chieh Lai, Sunnyvale, CA (US); Matthew Moskewicz, San Mateo, CA (US); Frank Gennari, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 563 days.

(21) Appl. No.: 12/208,167

(22) Filed: Sep. 10, 2008

(65) Prior Publication Data

US 2010/0064269 A1    Mar. 11, 2010

(51) Int. Cl.
  *G06F 17/50*    (2006.01)
  *G06F 9/455*    (2006.01)
(52) U.S. Cl. ........................................ 716/111; 716/106
(58) Field of Classification Search .................. 716/106, 716/111

See application file for complete search history.

(56) References Cited

U.S. PATENT DOCUMENTS

| | | | | |
|---|---|---|---|---|
| 6,418,551 | B1 * | 7/2002 | McKay et al. | 716/112 |
| 7,882,472 | B2 * | 2/2011 | Sardino et al. | 716/113 |
| 2007/0079269 | A1 * | 4/2007 | Corbeil et al. | 716/5 |
| 2007/0192754 | A1 * | 8/2007 | Hofsaess | 716/5 |
| 2010/0070936 | A1 * | 3/2010 | Lakshmanan et al. | 716/4 |
| 2010/0169854 | A1 * | 7/2010 | Boselli et al. | 716/5 |
| 2010/0257496 | A1 * | 10/2010 | Ferguson et al. | 716/5 |

* cited by examiner

*Primary Examiner* — Jack Chiang
*Assistant Examiner* — Magid Dimyan
(74) *Attorney, Agent, or Firm* — Kenyon & Kenyon LLP

(57) ABSTRACT

According to various embodiments of the invention, systems and methods for design rule checking enhanced with pattern matching is provided, wherein the design rule checker ignores certain patterns of the layout that violate design rules during validation. One embodiment of the invention includes receiving a first layout pattern that containing the original layout of an integrated circuit pattern. The pattern matcher processes the layout pattern and designates certain patterns of the integrated circuit pattern that meet a design waiver. The pattern matcher generates a second layout pattern with the waived patterns marked. The design rule checker subsequently processes the marked layout pattern and validates all but the marked patterns of the second layout pattern against a set of specified design rules. The design rule checker generates a third layout pattern with only the unmarked patterns of the layout being validated against the set of specified design rules.

26 Claims, 7 Drawing Sheets

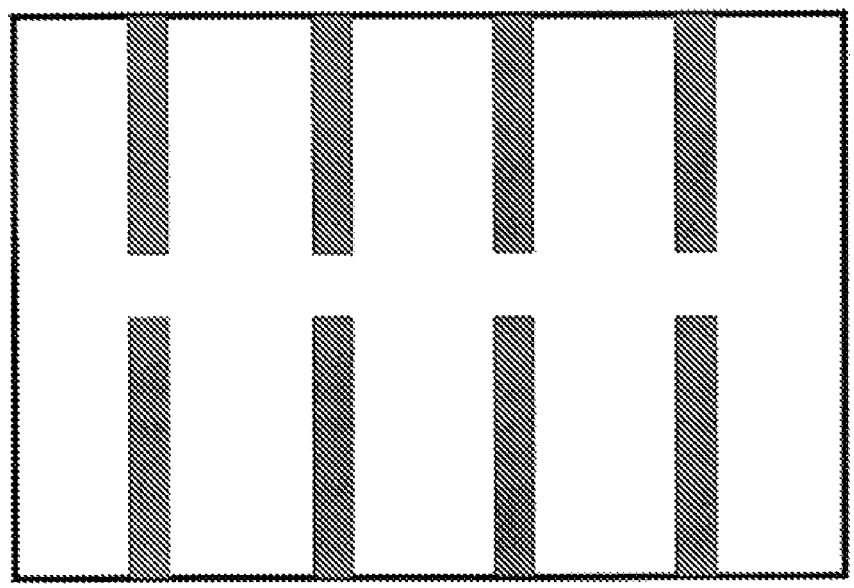
FIG. 5a
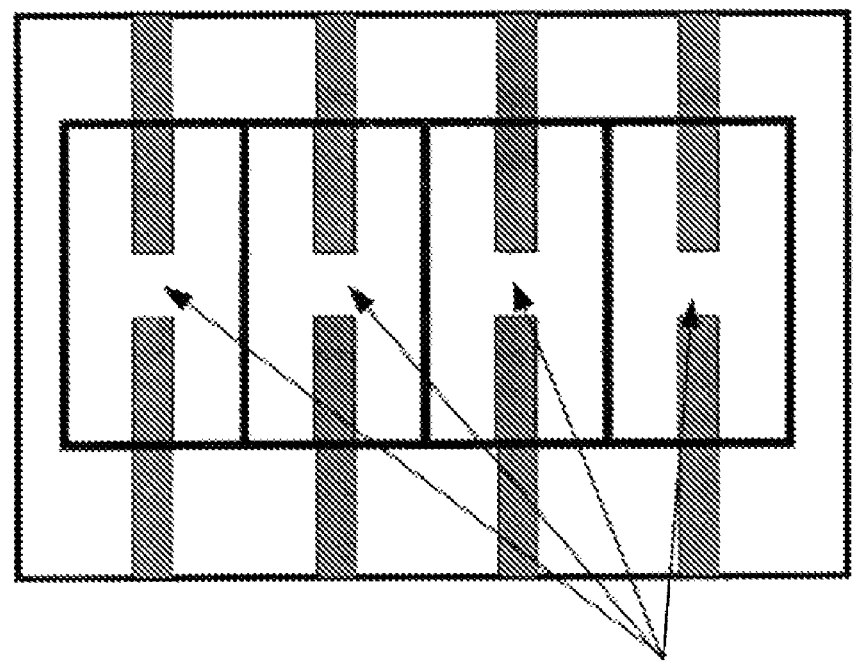
FIG. 5b     501

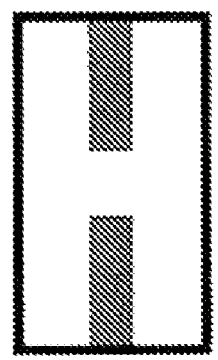
FIG. 6a
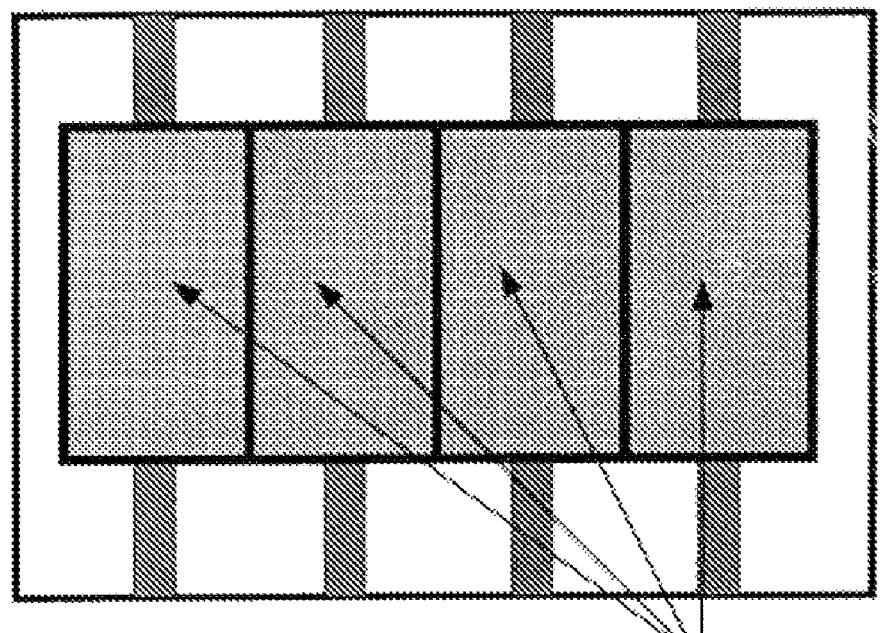
FIG. 6b          601

METHOD AND SYSTEM FOR DESIGN RULE CHECKING ENHANCED WITH PATTERN MATCHING

TECHNICAL FIELD

The present invention relates to design tools, and more particularly, some embodiments relate to a system and method for design rule checking in the field of integrated circuit layout design.

DESCRIPTION OF THE RELATED ART

Integrated circuits, or ICs, are generally created by patterning several layers of devices and their interconnections onto a substrate such as a semiconductor wafer. Generally, the process starts with the design of the integrated circuit using an electronic design automation (EDA) tool that allows a designer to interactively position and connect various components of the circuit. This design, in turn, is generated into a circuit layout by the electronic design automation tool. The circuit layout, also known simply as a layout, contains the physical locations and dimensions of the circuit's components, interconnections, and various layers. The components, interconnections, and various layers of the circuit form the features of the integrated circuit.

The integrated circuit design is eventually fabricated by transferring the circuit layout to a semiconductor substrate in a series of layers that collectively will form the features that constitute the devices that make up the components of the integrated circuit. However, before the layout can be fabricated, a validation process of the layout must take place.

In the validation stage of an integrated circuit layout, the layout is examined against a plurality of design rules that ensures that the layout conforms with particular technology constraints, also known as design rules. These design rules are based on various factors that include, but are not limited to, the specific limitations of a chosen integrated circuit fabrication methodology and common practices within the integrated circuit fabrication industry. In addition, circuit designers have the option of creating their own custom design rules for their circuit designs. Examples of such design riles include, but are not limited to, width rules, minimum area rules, enclosure rules, spacing rules, symmetry rules, and alignment rules.

Typically, the design validation process is handled by a verification tool, which processes a layout and verifies that the layout adheres to a set of specified design rules. One such verification tool is called a design rule checker (DRC). Often times the design rule checker is implemented as a stand-alone software program, such as Cadence Assura® DRC, or as a part of an electronic design automation tool, such as Cadence Virtuoso®. The design rule checker examines a layout for violations of a set of specified design rules. The layout is usually received by the design rule checker in the form of a file that digitally represents the layout of the circuit. Current formats for layout files include, but are not limited to, GDS II and OASIS. When a design rule checker observes a circuit feature within the layout that violates a particular design rule, the violation is flagged by the design rule checker. Examples of how this flagged violation can be brought to the designer's attention include, but are not limited to, marking the violation directly in a resulting output layout file or graphically bringing attention to the violation within the electronic design automation tool.

Currently, design rule checkers typically uniformly validate a layout file without discretion. In other words, when a design rule checker examines a layout for validation purposes, it examines all the circuit features of the layout against the specified set of design rules without bias. This, at times, results in the design rule checker marking certain configurations within the layout as a violation of a specific design rule even when the circuit designer intentionally meant for the violation to exist. This is especially true in instances where the layout's configuration is in violation of a design rule but is known to be a good layout configuration. There are instances where circuit designers may wish to waive certain design rules for their circuit designs.

BRIEF SUMMARY OF EMBODIMENTS OF THE INVENTION

According to various embodiments of the invention, systems and methods for design rule checking enhanced with pattern matching are provided, wherein the design rule checker ignores certain patterns of the layout that violate design rules during validation.

One embodiment includes a method of comparing patterns of the layout pattern against a set of design waiver patterns, designating certain patterns of the integrated circuit pattern that meet a design waiver, running the layout through a design rule checker, and treating those designated patterns as valid patterns. In some embodiments, the design rule checker validates the layout patterns against a set of design rules before the pattern matcher compares those patterns against the set of design waivers. In those embodiments, the pattern matcher compares the set of design waivers against only those patterns in the layout pattern in which the design rule checker finds and places a violation of a design rule from the set of design rules. Subsequently, when the pattern region matches a design waiver, that violation within the pattern region is cleared.

In other embodiments, the pattern matcher compares the patterns of the layout pattern against the set of design waivers before the design rule checker validates the layout pattern against a set of design rules. In such embodiments, when a pattern region is designated as matching a design waiver from the set, the design rule checker ignores the designated pattern region during its validation.

In yet other embodiments, a plurality of design waivers may be grouped and applied as a design waiver macroblock that matches a plurality of patterns within a known region of the layout.

In another embodiment, the set of design waivers is stored in a design waiver pattern store. In yet another embodiment, the set of design rules is stored in a design rule store.

In a further embodiment, the first layout pattern is in GDS II file format. In another embodiment, the first layout pattern is in OASIS file format.

In other embodiments, the method of this invention implemented as a computer program product that has computer readable program code embedded into a computer useable medium.

In another embodiment, the method of this invention implemented as part of a computer aided design apparatus.

In other embodiments, creating design waivers by designing a library of standard cells, assessing the manufacturability of the library, running a design rule check on regions of the library deemed to be manufacturable from the proceeding assessment, and capturing any design rule check violations that result as design waivers. In some such embodiments, a plurality of design waivers can be grouped into a design waiver macroblock that matches a plurality of patterns within a known region of a layout.

Other features and aspects of the invention will become apparent from the following detailed description, taken in conjunction with the accompanying drawings, which illustrate the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the appended drawings. The drawings are provided for purposes of illustration only and merely depict or example embodiments of the invention. These drawings are provided to facilitate the reader's understanding of the invention and shall not be considered limiting of the breadth, scope, or applicability of the invention.

FIG. 5a is a depiction illustrating a layout before being processed by a method for design rule checking.

FIG. 5b is a depiction illustrating a layout after the layout in FIG. 5a has being processed and designated for design waivers by a pattern matcher.

FIG. 6a is a depiction illustrating a poly layer design waiver used on FIG. 5a by the pattern matcher in FIG. 5b.

FIG. 6b is a depiction illustrating a of the regions of the layout of FIG. 5b ignored by the design rule checker during processing.

DETAILED DESCRIPTION OF THE EMBODIMENTS OF THE INVENTION

Figure 1:
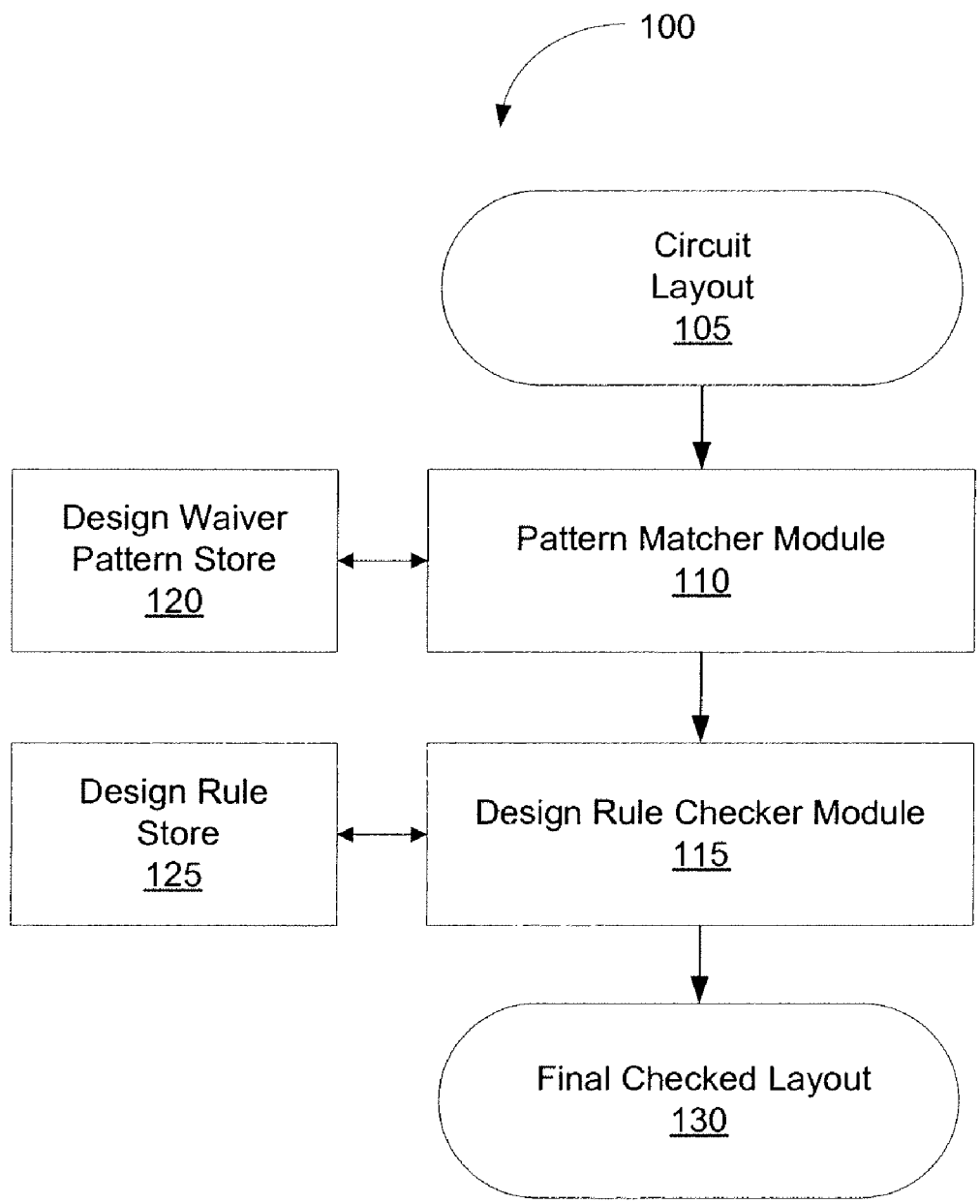
FIG. 1 is a block diagram illustrating a system for design rule checking enhanced with design waiver pattern matching.

The present invention is directed in various embodiments toward integrated circuits and systems and methods for layout design. Particularly, some embodiments relate to design rule checking integrated circuit layouts with pattern matching, examples of which are illustrated in the accompanying drawings, wherein like reference numerals refer to the like elements throughout.

In one embodiment, integrated circuits can be designed and validated against design rules in accordance with the systems and methods of the invention. For example, one embodiment of this invention is a process that can be used in conjunction with an electronic design automation (EDA) tool to validate an integrated circuit layout. Validation in this example can take place either as the layout is being designed or once the design has been completed. In some embodiments, the tool can be configured to process a circuit layout through a pattern matcher and design rule checker such that, despite the fact a configuration on the layout violates a specific design rule, the design rule checker will ignore that violation if that specific configuration has been pre-qualified as a good-pattern.

In some embodiments, the set of design waivers can be grouped into a design waiver macroblock where the design waiver macroblock applies to a plurality of patterns in a known region of a layout (also known simply as macroblocks). As long as a known region is found in a layout and known to not have changed, the patterns and pattern violations found within the macroblock are already known. Hence, once a macroblock is found within a layout, rather than applying design waivers to each pattern within the region, the entire region is considered waived and, thus, ignored by the design rule checker, such as through a set of design waivers.

FIG. 1 is a block diagram 100 illustrating a system for design rule checking enhanced with design waiver pattern matching. The example system comprises a circuit layout 105, a pattern matcher module 110, a design rule checker module 115, a design waiver pattern store 120, a design rule store 125, and a final checked circuit layout 130. Typically, a circuit layout such as circuit layout 105 or final checked layout 130 takes the form of a file. Examples of circuit layout file formats include, but are not limited to, GDS II and OASIS.

The pattern matcher module 110 serves the role of accepting circuit layout 105, searching for design waiver patterns applicable to circuit layout 105, obtaining the applicable design waiver patterns from the design waiver pattern store 120, designating regions of the original circuit layout that meet a design waiver pattern, and generating a circuit layout with these marked regions. Usually the pattern matcher module 110 generates an overlay file with matched regions marked that can be combined with the circuit layout 105. An example implementation of the design waiver pattern store 120 is a database of patterns along with some meta information that allows a certain amount of inexactness in the pattern match. Optionally, the design waiver pattern store 120 can contain a context-specific design rule associated with a pattern.

Next, the design rule checker module 115 accepts circuit layout 105 combined with an overlay file from the pattern matcher module 110. Recall, the overlay file contains regions within circuit layout 105 designated for matching a waiver pattern. The design rule check continues by examining whether undesignated regions of circuit layout 105 (those regions not designated within the overlay file) satisfy applicable design rules. Applicable design rules are obtained by the design rule checker module 115 from the design rule store 125. If the design rule checker module 115 finds a design rule violation, it reports it and marks the violation within generates a final checked layout 130 that is eventually generated by design rule checker module 115. Examples of design rule checkers include, but are not limited to, CADENCE ASSURA Design Rule Checker and CADENCE DRACULA. As well known in the art, a typical design rule checker determines whether a circuit layout satisfies a series of design rules. Design rule checker module 115 is an example implementation of such a design rule checker.

In an alternative embodiment (not illustrated), the circuit layout 105 and the overlay file created by the pattern matcher module 110 are not combined into a single file but are given separately to the design rule checker module 115.

In yet another alternative embodiment (not illustrated), the match regions from the pattern matcher module 110 are kept in memory, and the raw results are used directly by the design rule checker module 115 without generating an overlay file (as was generated in the embodiment identified before).

In an alternative embodiment (not illustrated), the design rule checker module 115 examines and validates the circuit layout 105 before the pattern matcher module 110 obtains applicable design waiver patterns from the design waiver pattern store 120 and designates patterns of the circuit layout 105 that meet a design waiver pattern. In such embodiments, the pattern matcher module 110 only applies the applicable design waivers patterns to patterns in which the design rule checker module 115 finds a violation of a design rule from the design rule store 125. If a pattern region with a design rule violation matches a design waiver from the design waiver pattern store 120, that violation is waived and cleared from the pattern region. If, however, some or all the violations are not waived, an unclean layout is generated by the pattern matcher module 110. An example method used by this embodiment will be further discussed in connection with FIG. 2.

Figure 2:
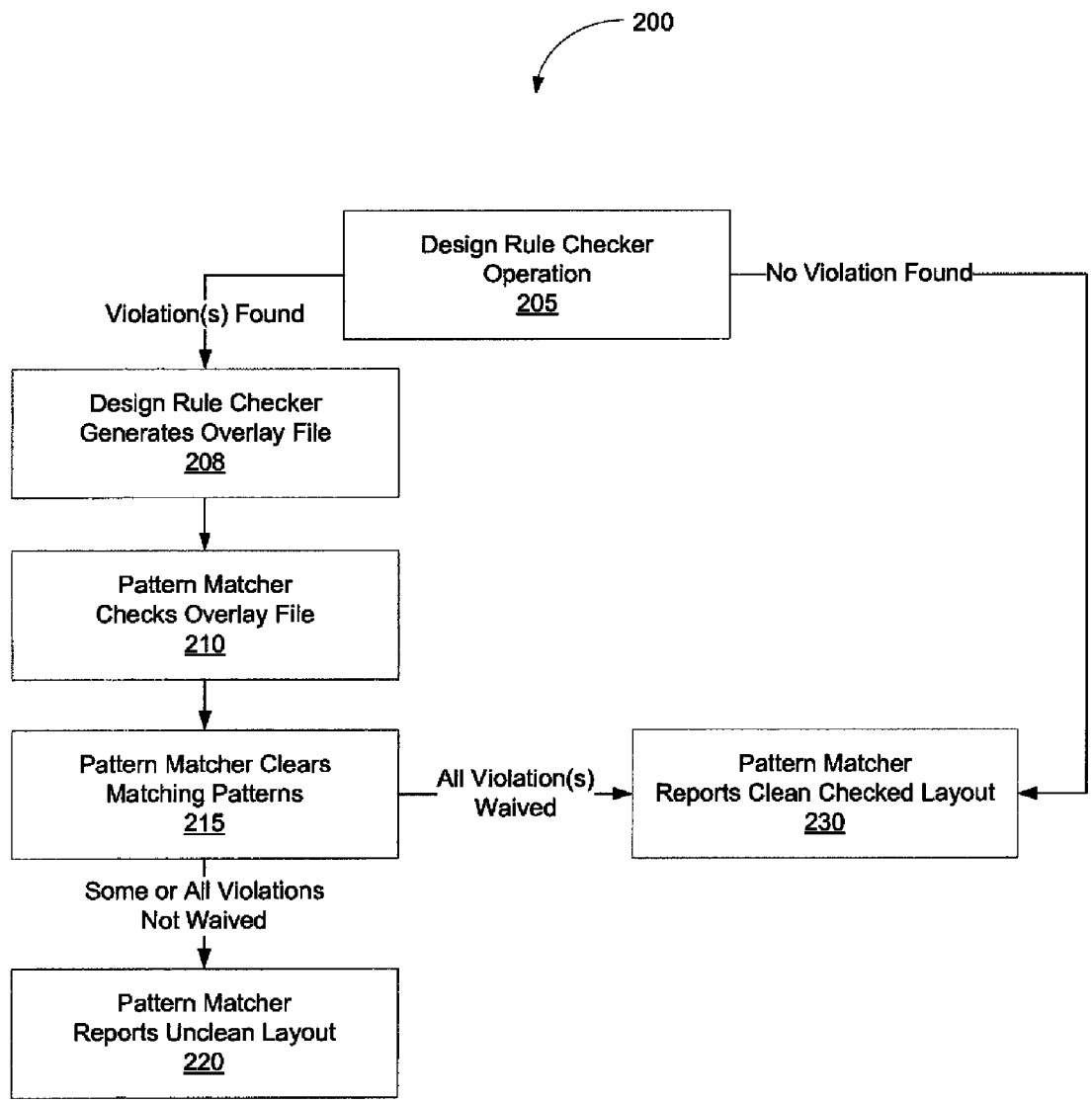
FIG. 2 is a flowchart illustrating a method for design rule checking enhanced with design waiver pattern matching.

FIG. 2 is a flowchart illustrating an example method 200 for design rule checking enhanced with design waiver pattern matching. Method 200 starts with the circuit layout 105 being processed by the design rule checker module 115 at operation 205. If no violations are found by design rule checker module 115 at operation 205, the design rule checker module 115 reports a clean checked layout 130 at operation 230. However, if one or more violations are found by the design rule checker module 115 at operation 205, at operation 208 the design rule checker module 115 generates an overlay file with matched regions marked that is combined with the circuit layout 105 to create a file containing the layout with patterns in violation of a design rule marked. The pattern matcher module 110 receives this file at operation 210 and checks the patterns marked as design violations against a plurality of design waivers. Of those patterns in violation, the patterns that match a design waiver are cleared by the pattern matcher module 110 at operation 215. If all the violations are waived by the pattern matcher module 110, the pattern matcher reports a clean layout 130 at operation 230. If, however, some violations remain at operation 215, the pattern matcher reports an unclean layout 225 at operation 220.

Figure 3:
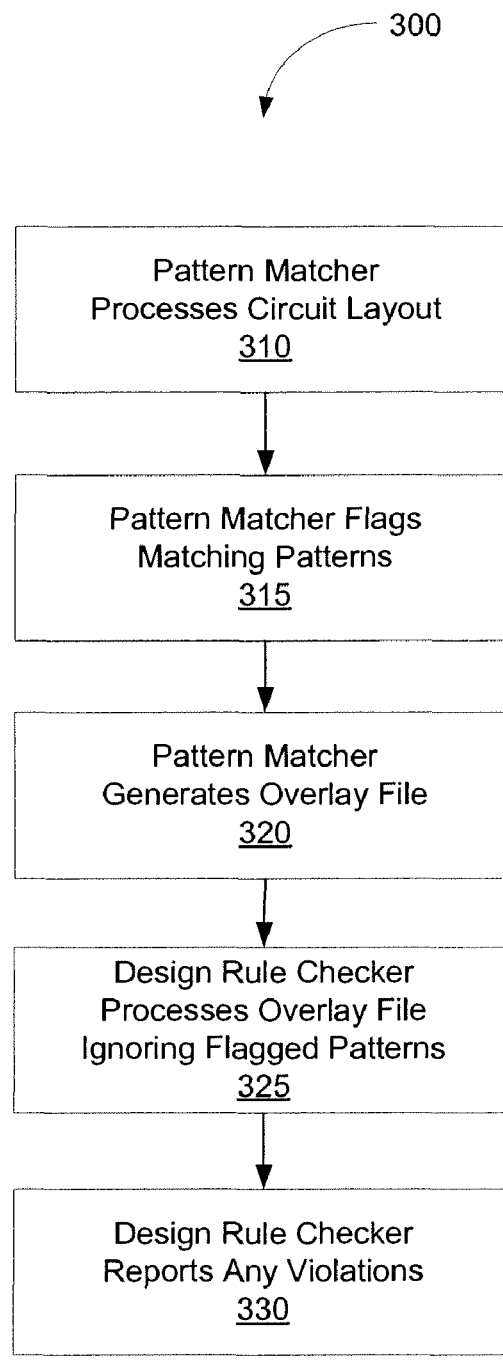
FIG. 3 is a flowchart illustrating a method for design rule checking enhanced with design waiver pattern matching.

FIG. 3 is a flowchart illustrating another example method 300 for design rule checking enhanced with design waiver pattern matching. This method 300 is used by various embodiments, such as the one illustrated in FIG. 1, where the pattern matcher module 110 is run on the layout file before the design rule checker module 115 receives the file. The original circuit layout 105 is processed by a pattern matcher module 110 at operation 310. At operation 315, the pattern matcher module 110 examines the circuit layout 105 for patterns that match design waivers stored in the design waiver pattern store 120. FIG. 5*a* depicts illustrating an example of circuit layout 105 before the circuit layout 105 is processed by a method such as method 300.

Design waivers are patterns in the layout that otherwise would be flagged as a violation of a design rule, but are pre-qualified as good or valid layout configurations. An instance in which such a design waiver is utilized includes, but is not limited to, when the designer wants the pattern matcher to mask out regions of the layout he or she does not want the design rule checker to examine. One of the benefits of such design waivers is it allows designers to be more aggressive with their integrated circuit designs than is allowed by standard design rules and typically provides for increased design density and increased circuit performance.

At operation 320, the pattern matcher generates an overlay layout file with the regions of the layout meeting a design waiver marked. In some instances, rectangles are used as markers over the regions of the layout where the circuit pattern matches a design waiver. FIG. 5*b* is a depiction illustrating an example layout generated by pattern matcher module 110 after the layout in FIG. 5*a* has been processed and designated with design waivers. Element 501 designates the matched regions in FIG. 5*b*. In the instance of FIG. 5*b*, FIG. 6*a* depicts the poly layer design waiver used by the pattern matcher module 110 to mark region 501.

Pattern matching technologies use several different methodologies to match designated patterns to patterns within a circuit layout. Two methods for specifying inexactness in pattern matching are utilized. The first method is image correlation while the second method is edge registration. In addition, assuming that the design waiver pattern store 120 contains a context-specific design rule associated with a pattern, the pattern matcher module 110 can optionally grant design waivers for regions only if (a) the pattern matcher has identified the context of the region and (b) the context passes the context-specific design rule checker rule.

At operation 325, the design rule checker module 115 examines the regions in the circuit layout 105 identified using the overlay file from the pattern matcher module 110 against a set of specified design rules obtained from the design rule store 125. While processing the layout, the design rule checker module 115 is configured to ignore regions of the layout marked by the pattern matcher module 110 in operation 320. As previously mentioned, these marked regions of the layout are regions to be ignored by design rule checker module 115 during layout validation. FIG. 6*b* illustrates the regions of FIG. 5*b*'s layout that are ignored by the design rule checker during processing. Element 601 designates those ignored regions.

Method 300 concludes at operation 330 with design rule checker module 115 reporting any design rule violations it has observed. Example formats in which the design rule checker module 115 reports these violations include, but are not limited to, generating a textual report of all the violations and generating a final checked layout 130 with the design rule violations marked on the layout or as a separate marker file.

Figure 4:
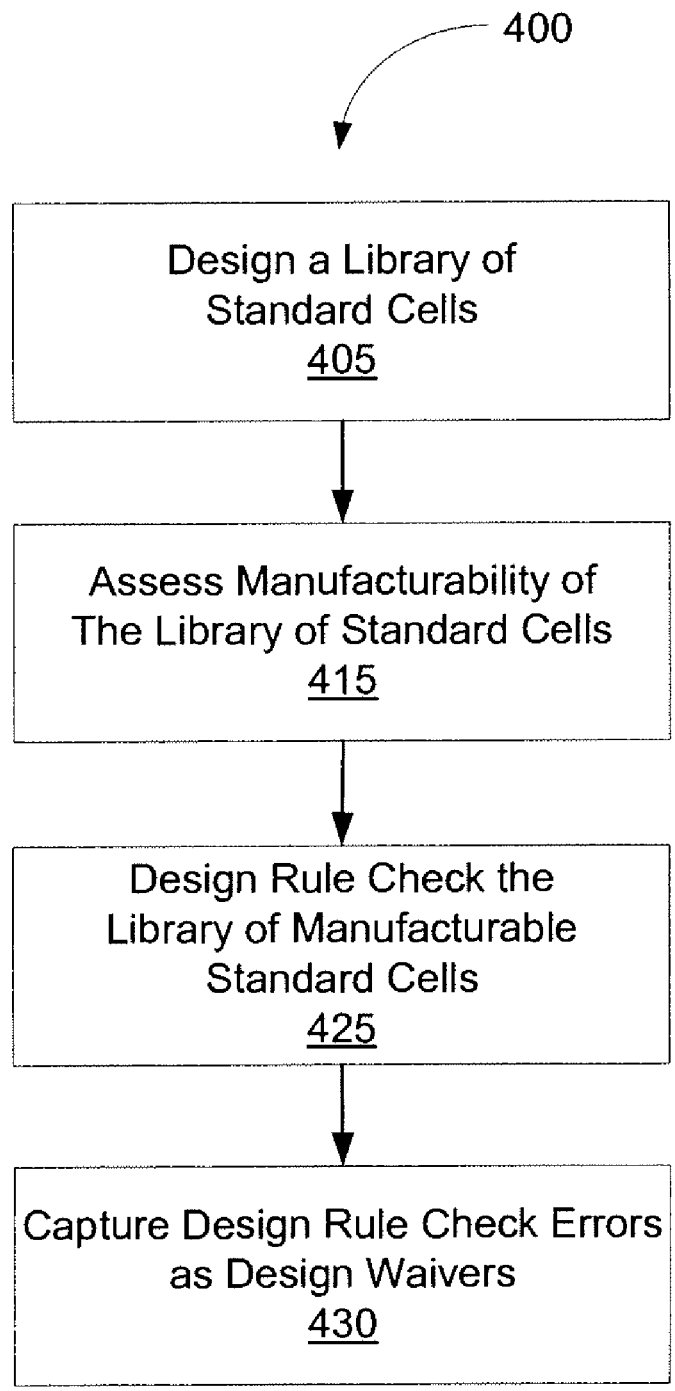
FIG. 4 is a flowchart illustrating a method for creating design waivers.

FIG. 4 is a flowchart illustrating an example method for creating design waivers. The method 400 begins with the designing of a library of standard cells at operation 405. The library of standard cells is used in the creation of layouts, with each cell containing the layout of a specific circuit component (e.g. AND gates, OR gates, LATCHES). These standard cells are not necessarily compliant with standard design rules (which may be very restrictive), but may, however, be composed of good or valid patterns. Hence, in order to determine if the standard cells are composed of good or valid patterns, the manufacturability of each cell is assessed at operation 415.

The manufacturability assessment is accomplished either by simulation or by actually printing the cell on silicon and assessing the results. The standard cells are placed in various contexts. The placement can be done randomly (e.g. put standard cell in random contexts of other standard cells), systematically (i.e. systematically do all possible permutations of standard cell contexts), or by allowing a place and route tool to put standard cells in likely real combinations. This results in a subset of the library of standard cells that are deemed to be manufacturable. This subset (library of manufacturable standard cells) is run through a design rule check at operation 425 with standard design rules. Any errors that result from the design rule check are captured at operation 430 as design waivers. They are usually placed into a waiver database, such as the design waiver pattern store 120 illustrated in FIG. 1. Note that these patterns that result in a violation can comprise an entire standard cell, portions of a standard cell, or a region of interaction between multiple standard cells.

Figure 7:
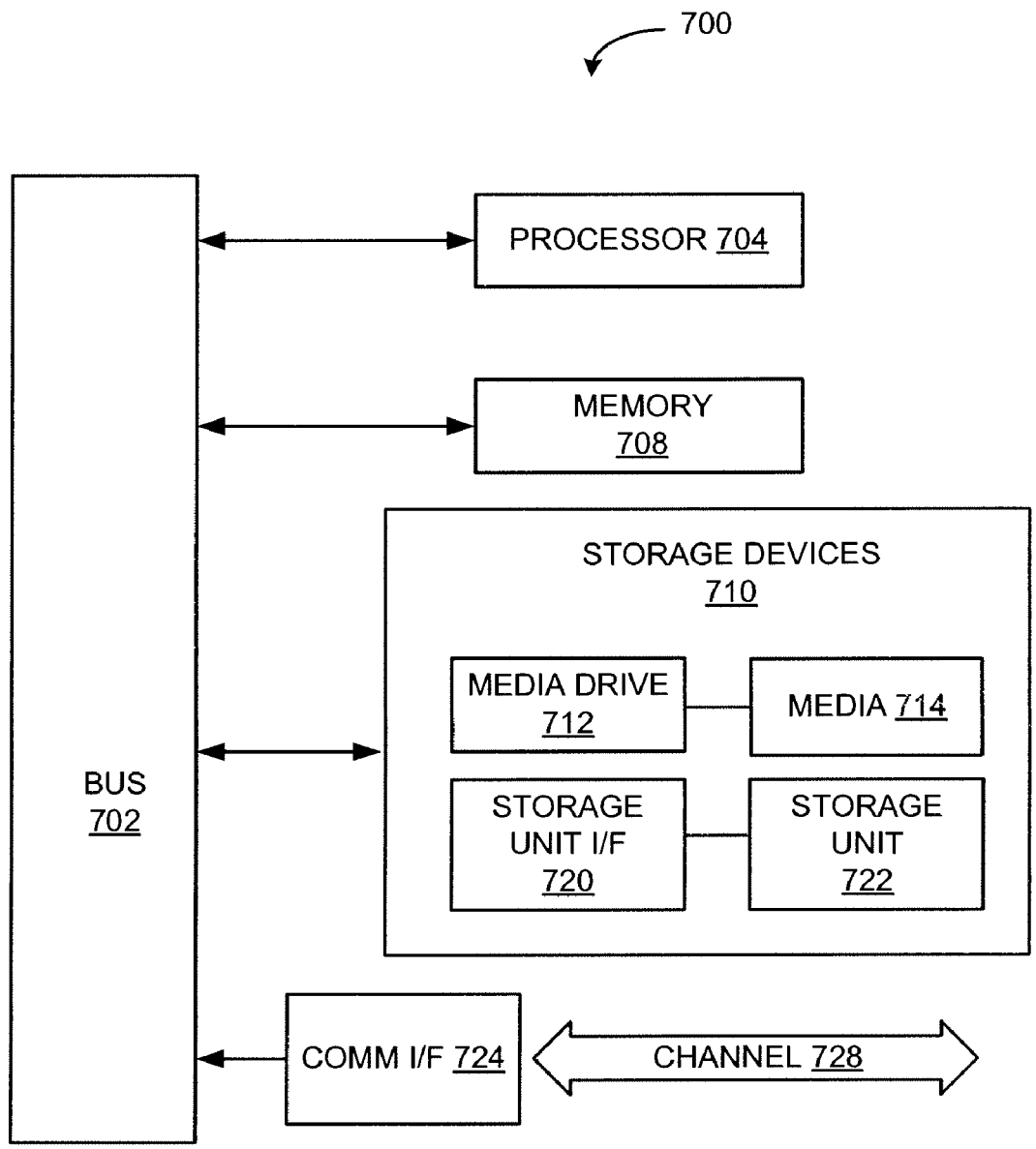
FIG. 7 is a diagram illustrating a computer system that can be used in conjunction with the systems and methods described herein.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 7. Various embodiments are described in terms of this example-computing module 700. After reading this description, it will become apparent to a person skilled in the relevant art how to implement the invention using other computing modules or architectures.

Referring now to FIG. 7, computing module 700 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 700 might also represent computing capabilities embedded within or otherwise available to a given device. For example, a computing module might be found in other electronic devices. Computing module 700 might include, for example, one or more processors or processing devices, such as a processor 704. Processor 704 might be implemented using a general-purpose or special-purpose processing engine such as, for example, a microprocessor, controller, or other control logic.

Computing module 700 might also include one or more memory modules, referred to as main memory 708. For example, random access memory (RAM) or other dynamic memory might be used for storing information and instructions to be executed by processor 704. Main memory 708 might also be used for storing temporary variables or other intermediate information during execution of instructions by processor 704. Computing module 700 might likewise include a read only memory ("ROM") or other static storage device coupled to bus 902 for storing static information and instructions for processor 704.

The computing module 700 might also include one or more various forms of information storage mechanism 710, which might include, for example, a media drive 712 and a storage unit interface 720. The media drive 712 might include a drive or other mechanism to support fixed or removable storage media 714. For example, a hard disk drive, a floppy disk drive, a magnetic tape drive, an optical disk drive, a CD or DVD drive (R or RW), or other removable or fixed media drive. Accordingly, storage media 714 might include, for example, a hard disk, a floppy disk, magnetic tape, cartridge, optical disk, a CD or DVD, or other fixed or removable medium that is read by, written to or accessed by media drive 712. As these examples illustrate, the storage media 714 can include a computer usable storage medium having stored therein particular computer software or data.

In alternative embodiments, information storage mechanism 710 might include other similar instrumentalities for allowing computer programs or other instructions or data to be loaded into computing module 700. Such instrumentalities might include, for example, a fixed or removable storage unit 722 and an interface 720. Examples of such storage units 722 and interfaces 720 can include a program cartridge and cartridge interface, a removable memory (for example, a flash memory or other removable memory module) and memory slot, a PCMCIA slot and card, and other fixed or removable storage units 722 and interfaces 720 that allow software and data to be transferred from the storage unit 722 to computing module 700.

Computing module 700 might also include a communications interface 724. Communications interface 724 might be used to allow software and data to be transferred between computing module 700 and external devices. Examples of communications interface 724 might include a modem or soft modem, a network interface (such as an Ethernet, network interface card, WiMedia, 702.XX or other interface), a communications port (such as for example, a USB port, IR port, RS232 port, Bluetooth interface, or other port), or other communications interface. Software and data transferred via communications interface 724 might typically be carried on signals, which can be electronic, electromagnetic, optical or other signals capable of being exchanged by a given communications interface 724. These signals might be provided to communications interface 724 via a channel 728. This channel 728 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 708, storage unit 720, media 714, and signals on channel 728. These and other various forms of computer program media or computer usable media may be involved in carrying one or more sequences of one or more instructions to a processing device for execution. When executed, such instructions might enable the computing module 700 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Terms and phrases used in this document, and variations thereof, unless otherwise expressly stated, should be construed as open ended as opposed to limiting. A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

What is claimed is:

1. A method of design rule checking of a dataset of a circuit layout, comprising:
    before using a design rule checker to validate the dataset against a plurality of design rules:
        comparing a plurality of patterns within the dataset against a plurality of design waivers, and
        designating a pattern within the plurality of patterns that matches a design waiver as a valid pattern, wherein the design waiver comes from the plurality of design waivers; and
    using the design rule checker, via a computer system, to validate only patterns within the plurality of patterns that are not designated a valid pattern.

2. The method of claim 1, wherein comparing the plurality of patterns is performed by a pattern matcher and the dataset defines an original layout comprising the plurality of patterns.

3. The method of claim 1, wherein a design waiver macroblock comprises the plurality of design waivers matches within a region of the dataset and the region is designated as such.

4. The method of claim 1, wherein the design rule checker performs the design rule check by validating the dataset against a plurality of design rules.

5. The method of claim 4, wherein the plurality of design rules is stored in a design rule store.

6. The method of claim 1, wherein the pattern matcher compares the plurality of patterns against the plurality of design waivers before the design rule checker validates the dataset against a plurality of design rules.

7. The method of claim 6, wherein the plurality of design es is stored in a design rule store.

8. The method of claim 6, wherein the design rule checker ignores the plurality of valid patterns when validating the dataset.

9. The method of claim 1, wherein the plurality of design waivers is stored in a design waiver pattern store.

10. The method of claim 1, wherein the dataset is stored in GDS II file format or OASIS file format.

11. A computer aided design apparatus for generating a data file for a layer of a semiconductor device, comprising:
    a processor;
    a memory connected to the processor; and
    a non-transitory computer readable medium having instructions embedded therein, the instructions configured to cause the processor to perform the operations of:
        before using a design rule checker to validate the dataset against a plurality of design rules:
            comparing a plurality of patterns within the dataset against a plurality of design waivers, and
            designating a pattern within the plurality of patterns that matches a design waiver as a valid pattern, wherein the design waiver comes from the plurality of design waivers; and
        using the design rule checker to validate only patterns within the plurality of patterns that are not designated a valid pattern.

12. The computer aided design apparatus of claim 11, wherein comparing the plurality of patterns is performed by a pattern matcher and the dataset defines an original layout comprising the plurality of patterns.

13. The computer aided design apparatus of claim 11, wherein a design waiver macroblock comprises the plurality of design waivers matches within a region of the dataset and the region is designated as such.

14. The computer aided design apparatus of claim 11, wherein the design rule checker performs the design rule check by validating the dataset against a plurality of design rules.

15. The computer aided design apparatus of claim 11, wherein the pattern matcher compares the plurality of patterns against the plurality of design waivers before the design rule checker validates the dataset against a plurality of design rules.

16. The computer aided design apparatus of claim 15, wherein the design rule checker ignores the plurality of valid patterns when validating the dataset.

17. The computer aided design apparatus of claim 11, wherein the plurality of design waivers is stored in a design waiver pattern store.

18. The computer aided design apparatus of claim 11, wherein the dataset is stored in GDS II file format or OASIS file format.

19. A computer program product having instructions embedded in a non-transitory computer useable medium, the instructions configured to cause a processor to perform the operations of:
    before using a design rule checker to validate the dataset against a plurality of design rules:
        comparing a plurality of patterns within the dataset against a plurality of design waivers, and
        designating a pattern within the plurality of patterns that matches a design waiver as a valid pattern, wherein the design waiver comes from the plurality of design waivers; and
    using the design rule checker to validate only patterns within the plurality of patterns that are not designated a valid pattern.

20. The computer program product of claim 19, wherein comparing the plurality of patterns is performed by a pattern matcher and the dataset defines an original layout comprising the plurality of patterns.

21. The computer program product of claim 19, wherein a design waiver macroblock comprises the plurality of design waivers matches within a region of the dataset and the region is designated as such.

22. The computer program product of claim 19, wherein the design rule checker performs the design rule check by validating the dataset against a plurality of design rules.

23. The computer program product of claim 19, wherein the pattern matcher compares the plurality of patterns against the plurality of design waivers before the design rule checker validates the dataset against a plurality of design rules.

24. The computer program product of claim 23, wherein the design rule checker ignores the plurality of valid patterns when validating the dataset.

25. The computer program product of claim 19, wherein the plurality of design waivers is stored in a design waiver pattern store.

26. The computer program product of claim 19, wherein the dataset is stored in GDS II file format or OASIS file format.

* * * * *